United States Patent
Hickman

(10) Patent No.: US 6,529,274 B1
(45) Date of Patent: Mar. 4, 2003

(54) SYSTEM FOR PROCESSING SEMICONDUCTOR PRODUCTS

(75) Inventor: Craig A. Hickman, Meridan, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/309,886

(22) Filed: May 11, 1999

(51) Int. Cl.[7] .............................................. G01B 11/00
(52) U.S. Cl. .................................... 356/399; 250/491.2
(58) Field of Search .......................... 250/491.1, 492.2; 356/399, 400; 355/55; 414/783, 744.8

(56) References Cited

U.S. PATENT DOCUMENTS

| | | | | |
|---|---|---|---|---|
| 4,704,027 A | * | 11/1987 | Phillips | |
| 5,424,548 A | * | 6/1995 | Puisto | 250/491.1 |
| 5,597,590 A | * | 1/1997 | Tanimoto et al. | 219/121.61 |
| 5,795,687 A | | 8/1998 | Yasuda | 430/22 |
| 6,038,029 A | * | 3/2000 | Finarov | |
| 6,288,773 B2 | * | 9/2001 | Johnson et al. | 355/30 |

OTHER PUBLICATIONS

Micro magazine.com; MICRO:Archive:Jan. 1997:Product Extra; 2 total pages.
Micro magazine.com; MICRO:Archive:Feb. 1997:World Beat; 2 total pages.
Micro magazine.com; MDL:MICRO:Nov./Dec. 1997:Ind-News:Order Desk; 2 total pages.
Micro magazine.com; MICRO:Jun. 98: Industre News:300–mm Imperative; 2 total pages.
Micro magazine.com; MDL:Micro:Nov./Dec. 1997: Ind-News:Expansions and . . . ; 2 total pages.
Ultra Stepper and ASM Lithography in preliminary discussion to form strategic alliance; Ultratech Stepper Inc.; 2 total pages.
ASML; Product Line Overview; 2 total pages.
The Center for Precision Machining Inc.; "300mm Wafer chucks fir semiconductor" Industry 1 page.
300mm Wafer Manufacturing Technology: More is Less in Semiconductor Production; 3 total pages.
Micro magazine.com; MICRO:Industry Nwes: 'Round the Circuit; (Jan. '99); 3 total pages.
Tom Cheyney; Micro magazine.com; MICRO:Archive:Jul. 97:Facility Report; "Transferring technology to industrial par LETI's Grenoble Center"; 4 total pages.
"Study on Advanced Technology of Next Generation Devices"; 2 total pages
DeJule; "Why Do We Care About $CaF_2$?" Semiconductor Net5, Technology News, Jan. 1999; 2 total pages.
Oakley; Special Situation, Omicron Technologies, Inc.; Conservative Speculator; 4 total pages.
Malinovich; "Process Control Enhances CMOS Sensors"; Photonics Online; 8 total pages.

* cited by examiner

Primary Examiner—Frank G. Font
Assistant Examiner—Tu T Nguyen
(74) Attorney, Agent, or Firm—Dickstein Shapiro Morin & Oshinsky LLP

(57) ABSTRACT

A system is provided for processing a semiconductor wafer. The wafer is pre-aligned at a first workstation. The pre-alignment may be accomplished by an edge sensor. Alignment mark portions of the wafer are exposed at the same workstation. A fiber optic bundle may be used to expose the alignment mark portions. A high degree of accuracy is not needed to expose the alignment mark portions. The accuracy achieved by the pre-alignment mechanism and the fiber optic bundle is sufficient. The invention saves processing time at a subsequent stepper or scanner exposure workstation.

6 Claims, 3 Drawing Sheets

SYSTEM FOR PROCESSING SEMICONDUCTOR PRODUCTS

BACKGROUND OF THE INVENTION

1. Field of the Invention

The present invention relates to an apparatus and method for handling semiconductor products, such as wafers and other workpieces. More particularly, the invention relates to a system for pre-aligning and processing a semiconductor wafer in a stepper or scanner exposure manufacturing process.

2. Discussion of the Related Art

Semiconductor dies are typically fabricated on a wafer formed of silicon and/or other materials. Integrated circuits are formed in the dies by photolithographic processes. For each photolithographic process, the wafer is coated with photoresist material, and then a reticle is used to expose a pattern in the photoresist material, and then the exposed photoresist material is removed to form an etch or deposition pattern.

Alignment marks may be etched or otherwise formed in the surface of the wafer. The alignment marks may be used to position the reticle precisely with respect to the die portions. That is, the locations of the die portions may be determined by the exposure apparatus based on the positions of the alignment marks.

In a "global" alignment process, two or more alignment marks, also called "combi" marks, are etched on the periphery of the wafer. A two-dimensional positioning system uses the alignment marks to accurately position a stepper exposure apparatus over successive die portions. The die portions are sequentially located and exposed by the stepper apparatus to develop the desired pattern in each die portion. Then a chemical bath is used to strip away the developed photoresist material, leaving the fine lines that eventually form the working integrated circuits.

During the photolithographic processes discussed above, the same photoresist material that covers the die portions is also coated on the alignment portions. The photoresist material on the alignment portions must be exposed so that it can be removed with the exposed material on the die portions. Unlike the exposure of the die portions, however, the exposure of the alignment mark portions does not require a high degree of accuracy. The apparatus used to expose the photoresist material on the alignment marks does not need to be precisely positioned.

There is a need in the art to reduce the processing time required to fabricate semiconductor devices. In particular, there is a need in the art to reduce the amount of time required to process wafers at exposure workstations.

SUMMARY OF THE INVENTION

The present invention relates to a system for processing a semiconductor wafer (or other workpiece) having a large number of die portions. The system has a first workstation with an alignment mechanism and a light source. The alignment mechanism is used to pre-align the wafer. The alignment mechanism is also used to locate alignment marks formed in the wafer. The light source is used to expose the alignment mark portions.

In addition, the system has a second workstation having an alignment mechanism and a light source. The second alignment mechanism is used to accurately align the second light source with respect to the alignment marks. The second light source has a reticle and is used to expose the desired pattern into the photoresist material on the die portions. A transport mechanism may be used to transport the wafer to the second workstation.

An advantage of the invention is that, since the alignment mark portions are exposed at the first workstation, they do not need to be exposed at the second workstation. Consequently, the invention makes it possible to reduce the amount of processing time required at the second workstation.

According to another aspect of the invention, the alignment mechanism of the first workstation includes an optical sensor for detecting the peripheral edge of the wafer and/or a notch (or flat) formed in the edge. The alignment mechanism may cooperate with a table supporting the wafer to provide the desired alignment. The alignment mechanism of the first workstation may be less accurate than the alignment mechanism of the second workstation.

The light source at the first workstation may transmit ultraviolet light through a flexible optical fiber cable. The flexible cable may be moved by a motor/encoder assembly laterally from one alignment mark portion to another. The motor/encoder assembly may be operated in accordance with signals from a controller that is operatively connected to other elements of the first workstation.

The present invention also relates to a method of processing a semiconductor wafer. The method includes the steps of pre-aligning the wafer at a first workstation, exposing photoresist material on pre-formed alignment marks at the first workstation, and then, at a second workstation, using the alignment marks to accurately align a stepper exposure apparatus.

A suitable transport mechanism may be used to move wafers to and from the second workstation. In a preferred embodiment of the invention, successive wafers may be supplied on elevators or from a coat/develop track. A robotic apparatus may be used to move the wafers one-by-one from the input source to the first workstation. A mechanism may also be provided for removing processed wafers from the second workstation.

Exposing the alignment mark portions at the first workstation saves overall processing time by reducing the amount of exposure time required at the second workstation. In a preferred embodiment of the invention, ten or more seconds may be saved from the overall processing time for each wafer by exposing the alignment mark portions at the first workstation. Another advantage of the invention is that commercially available equipment may be used to mount and movably support the exposure lamp at the first workstation.

These and other features and advantages of the present invention will become more apparent upon consideration of the following detailed description and attached drawings.

DETAILED DESCRIPTION OF PREFERRED EMBODIMENTS

Figure 1:
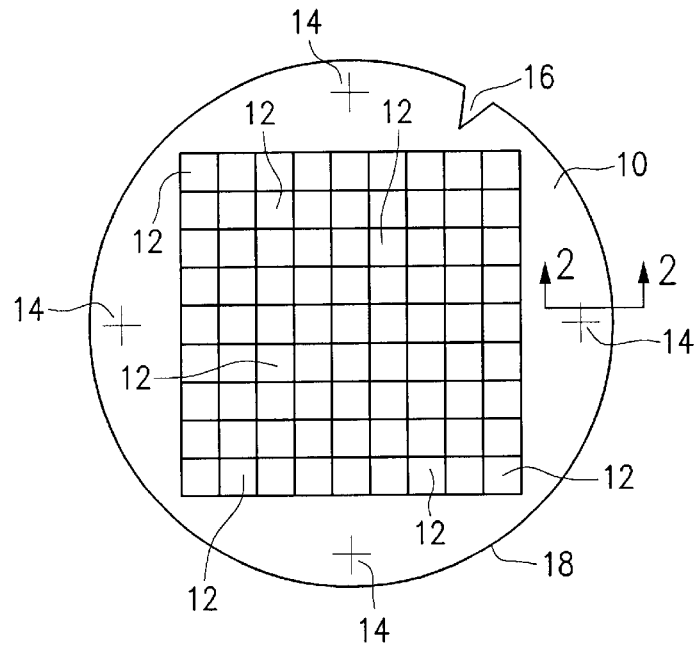
FIG. 1 is a top view of a semiconductor wafer for the present invention.

Referring now to the drawings, where like elements are designated by like reference numerals, there is shown in FIG. 1 a semiconductor wafer 10 for use in the present invention. The wafer 10 has a large number of die portions 12, two or more global alignment (combi) mark portions 14, and a notch 16. The die portions 12 contain integrated circuits (not illustrated). The die portions 12 are formed in a grid pattern. That is, the die portions 12 are aligned in rows and columns so that they can be singulated by a sawing process or the like.

The die portions 12 are covered by photoresist material. The photoresist material may be used to form etch masks to create fine lines in the integrated circuits.

The notch 16 is formed in the peripheral edge 18 of the wafer 10. The invention may also be used with wafers that have flats instead of the illustrated notch 16. The invention is not limited to the preferred embodiments shown and described herein.

Figure 2:
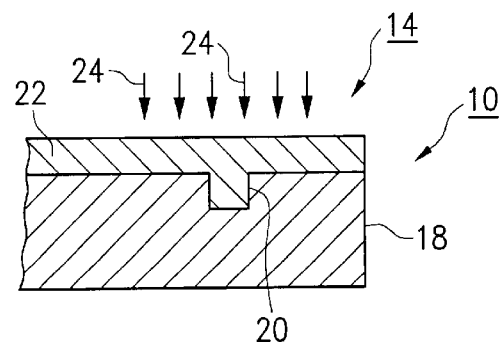
FIG. 2 is a partial cross sectional view of the wafer of FIG. 1, taken along the line 2—2.

Referring now to FIG. 2, the alignment mark portions 14 include alignment marks 20 that are etched or otherwise formed in the semiconductor wafer 10. The alignment marks 20 form a pattern that can be identified and precisely located by a stepper exposure apparatus (described in more detail below). The alignment marks 20 may be covered by the same photoresist material 22 that covers the die portions 12. The positions of the die portions 12 relative to the positions of the alignment marks 20 are predetermined.

Figure 3:
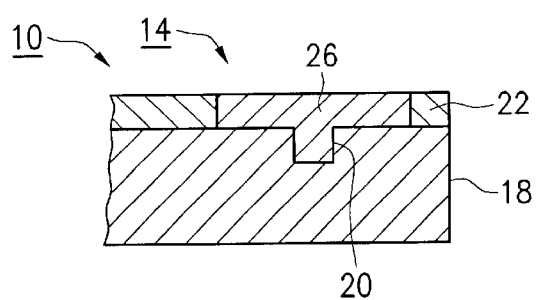
FIG. 3 is a partial cross sectional view like FIG. 2, showing the wafer at a subsequent stage of manufacture (after exposure of the photoresist material on the alignment marks).

In operation, the photoresist material 22 is exposed to ultraviolet light 24. The exposed photoresist material 26 (FIG. 3) may be removed from the wafer 10 at a subsequent workstation to uncover the alignment marks 20. The uncovered alignment marks may be referred to as "clear fields."

Figure 4:
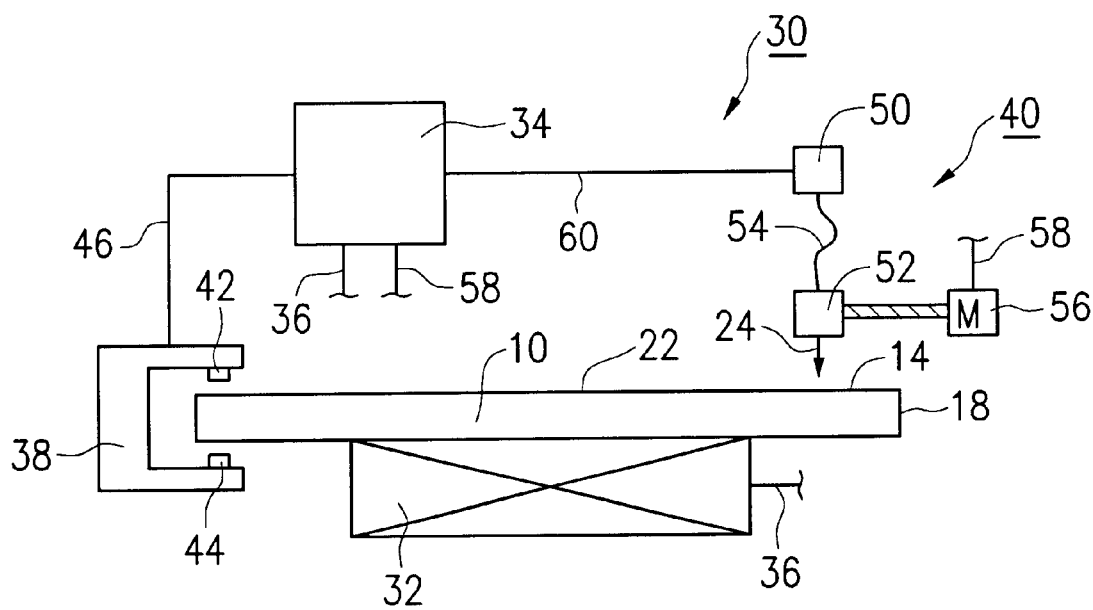
FIG. 4 is a side view of a workstation for handling semiconductor wafers in accordance with a preferred embodiment of the present invention.

FIG. 4 shows a first workstation 30 for pre-aligning the wafer 10 and for exposing the alignment mark portions 14. The first workstation 30 has a wafer table (or vacuum chuck) 32 for supporting the wafer 10. The wafer table 32 may be rotated and/or moved laterally to locate the wafer 10 in the desired position. The movement of the table 32 may be controlled by a suitable controller 34. The controller 34 may be, for example, a suitable general purpose programmable microprocessor. The controller 34 may be operatively connected to the table 32 by a suitable control system 36.

The first workstation 30 may be provided with an edge sensor 38 and an exposure system 40. The edge detector 38 is located on the perimeter of the wafer table 32 to sense the location of the wafer edge 18 and/or the notch 16. The sensor 38 has a light emitter 42 and a receiver 44 which cooperate to determine the location of the edge 18 and/or the notch 16. The sensor 38 generates signals that are representative of the coordinate position of the wafer 10 with respect to the support mechanism 32. The signals are received by the controller 34 via a suitable signal line 46.

The exposure system 40 includes a light source 50, a lamp 52, and a flexible cable 54. The cable 54 has an optical fiber bundle for transmitting ultraviolet light from the source 50 to the lamp 52.

The lamp 52 is moved across the surface of the wafer 10 by a suitable motor/encoder assembly 56. The motor/encoder assembly 56 is operated in accordance with signals from the controller 34 via a signal line 58. The controller 34 determines the coordinate positions of the alignment marks 20 based on coordinate position data provided by the edge sensor 38. The controller 34 actuates the light source 50 via signals transmitted on another signal line 60.

Figure 5:
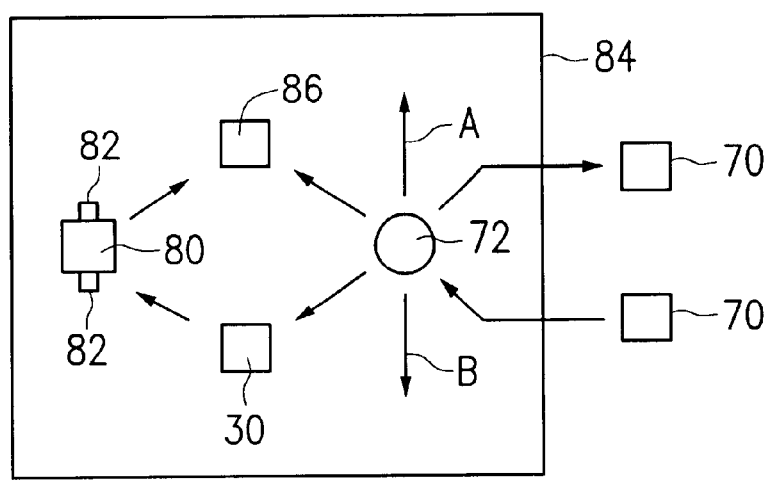
FIG. 5 is a schematic view of a system for processing semiconductor wafers in accordance with the present invention.
Figure 6:
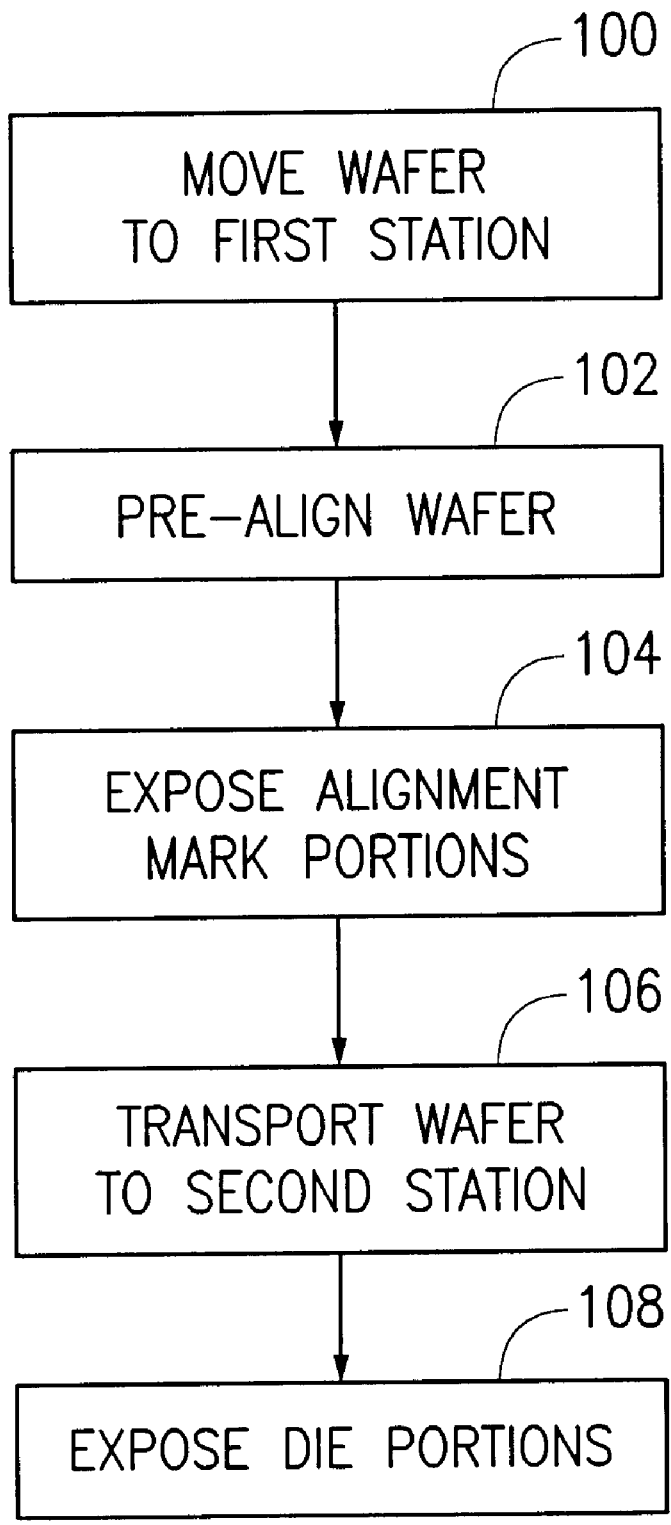
FIG. 6 is a flow chart for the processing system of FIG. 5.

In operation, wafers 10 are supplied by some input source 70 (FIG. 5). A robotic mechanism 72 moves the wafers 10 one-by-one to the apparatus 30 (the first workstation) (FIG. 6, Step 100). The robotic mechanism 72 is movable in the direction of arrows A, B to retrieve a wafer 10 from an input source 70. After the selected wafer 10 is secured to the wafer table 32, the positions of the wafer edge 18 and/or the notch 16 are determined by the edge sensor 38. Based on information from the edge sensor 38, the wafer 10 is rotated to a desired pre-alignment position (Step 102).

Then, while the wafer 10 is still located at the first workstation 30, the wafer alignment mark portions 14 are exposed one at a time by the lamp 52 (Step 104). The exposure of the alignment mark portions 14 may be called "combi clearing." Subsequently, the wafer 10 is moved by a mechanism (not illustrated) to a second workstation 80 (Step 106). The transport mechanism preserves the pre-alignment positioning of the wafer 10 so that the wafer 10 is at least approximately in the desired position for stepper exposure processing when it arrives at the second workstation 80.

There is an alignment laser 82 that is used to precisely locate the positions of the alignment marks 20 on the wafer 10. The second workstation 80 uses the alignment marks 20 to perform a precise stepper exposure process on the die portions (or "die fields") 12 (Step 108). The stepper exposure apparatus 84 may be operatively connected to the alignment laser 82 in a manner known in the art.

The stepper exposure apparatus 84 has a reticle and a source of ultraviolet light. The ultraviolet light generated by the stepper exposure apparatus 84 may have a shorter wavelength than the light generated by the light source 50 at the first workstation 30. A shorter wavelength light may be required at the second workstation 80 because of the fine, detailed patterning that is performed at the second workstation 80. In a preferred embodiment of the invention, the light generated by the stepper exposure apparatus 84 may be monochromatic with a wavelength of about two hundred forty eight nanometers (deep ultraviolet).

While the wafer 10 is being processed at the second workstation 80, a subsequent wafer (not illustrated) may be pre-aligned and combi cleared at the first workstation 30. By combi clearing the alignment mark portions 14 at the first workstation 30, the processing time at the second workstation 80 may be reduced by ten or more seconds per wafer.

From the second workstation 80, the wafer 10 is moved to a discharge unit 86 (FIG. 5). From there, the wafer 10 may be returned to the input source 70 by the robotic mechanism 72. The wafer 10 can then be moved to an etch processing workstation (not illustrated), for example.

The above description illustrates preferred embodiments which achieve the features and advantages of the present invention. It is not intended that the present invention be limited to the illustrated embodiments. For example, the invention is not limited to the specific alignment marks 14, 20 shown in FIGS. 1–3. The invention may be practiced with a variety of alignment marks. Any modification of the present invention that comes within the spirit and scope of the following claims should be considered part of the present invention.

What is claimed as new and desired to be protected by Letters Patent of the United States is:

1. A system for processing a semiconductor work piece, said system comprising:
   a first workstation including an alignment mechanism for performing an alignment upon the semiconductor workpiece, and a light source for selectively exposing alignment mark portions of the work piece;
   a second workstation having an alignment mechanism for aligning the semiconductor workpiece, and a light source for exposing die portion of the work piece; and
   a transport mechanism for transporting the semiconductor work piece from said first workstation to said second workstation;
   wherein said transport mechanism preserves the alignment of the workpiece at the second workstation.

2. The system of claim 1, wherein said alignment mechanism of said first workstation includes a sensor for detecting an edge of the semiconductor workpiece.

3. The system of claim 2, wherein said alignment mechanism of said first workstation is arranged to detect a notch in the edge of the semiconductor workpiece.

4. The system of claim 1, wherein said light source of said first workstation includes a source of ultraviolet light.

5. The system of claim 4, further comprising a fiber optic cable for transmitting light to the alignment mark portions.

6. The system of claim 5, further comprising a motor for moving said cable to sequentially expose the alignment mark portions.

* * * * *

UNITED STATES PATENT AND TRADEMARK OFFICE
CERTIFICATE OF CORRECTION

PATENT NO.    : 6,529,274 B1                                           Page 1 of 1
DATED         : March 4, 2003
INVENTOR(S)   : Craig A. Hickman It is certified that error appears in the above-identified patent and that said Letters Patent is hereby corrected as shown below:

Title page,
Item [56], References Cited, OTHER PUBLICATIONS,
8th reference should read:
-- The Center for Precision Machining, Inc; "300mm Wafer chucks for semiconductor" Industry 1 page. --
And add:
-- The Center for Precision Machining Inc.; Wafer handling chucks for the semiconductor ...; 2 total pages.
Micro magazine.com; MICRO:Industry News: 'ROUND THE CIRCUIT; (Jan. '99); 3 total pages. --

Signed and Sealed this

Twenty-second Day of July, 2003

JAMES E. ROGAN
*Director of the United States Patent and Trademark Office*